(12) United States Patent
Lai et al.

(10) Patent No.: US 11,646,738 B2
(45) Date of Patent: May 9, 2023

(54) PROCESSOR WITH ADJUSTABLE OPERATING FREQUENCY

(71) Applicant: Realtek Semiconductor Corp., HsinChu (TW)

(72) Inventors: Chao-Min Lai, HsinChu (TW); Han-Chieh Hsieh, HsinChu (TW); Tang-Hung Chang, HsinChu (TW); Hung-Wei Wang, HsinChu (TW); Chun-Yi Kuo, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 17/695,821

(22) Filed: Mar. 15, 2022

(65) Prior Publication Data
US 2022/0416789 A1 Dec. 29, 2022

(30) Foreign Application Priority Data
Jun. 29, 2021 (TW) .................................. 110123781

(51) Int. Cl.
*H03K 19/0185* (2006.01)
*H03K 19/00* (2006.01)
*H03K 19/17784* (2020.01)

(52) U.S. Cl.
CPC ... *H03K 19/01855* (2013.01); *H03K 19/0016* (2013.01); *H03K 19/17784* (2013.01)

(58) Field of Classification Search
CPC ............... H03K 19/00; H03K 19/0016; H03K 19/01855; H03K 19/17784

USPC ......................................................... 327/156
See application file for complete search history.

(56) References Cited

U.S. PATENT DOCUMENTS

| 11,036,253 B1* | 6/2021 | Paternoster ........... H03L 7/0995 |
| 2004/0183613 A1 | 9/2004 | Kurd |
| 2021/0141407 A1 | 5/2021 | Lai et al. |

FOREIGN PATENT DOCUMENTS

| TW | 201304395 A1 | 1/2013 |
| TW | 202044031 A | 12/2020 |
| TW | 202101151 A | 1/2021 |

* cited by examiner

*Primary Examiner* — Menatoallah Youssef
*Assistant Examiner* — Dave Mattison
(74) *Attorney, Agent, or Firm* — Winston Hsu

(57) ABSTRACT

The present invention provides a processor including a core circuit, a plurality of clock signal generation circuits, a multiplexer and a detection circuit is disclosed. The core circuit is supplied by a supply voltage. The plurality of clock signal generation circuits are configured to generate a plurality of clock signals with different frequencies, respectively, wherein a number of the plurality of clock signals is equal to or greater than three. The multiplexer is configured to receive the plurality of clock signals, and to select one of the plurality of clock signals to serve as an output clock signal according to a control signal, wherein the core circuit uses the output clock signal to serve as an operating clock. The detection circuit is configured to detect a level of the supply voltage received by the core circuit in a real-time manner, to generate the control signal.

9 Claims, 3 Drawing Sheets

PROCESSOR WITH ADJUSTABLE OPERATING FREQUENCY

BACKGROUND OF THE INVENTION

1. Field of the Invention

The present invention relates to a processor with adjustable operating frequency.

2. Description of the Prior Art

When a central processing unit (CPU) or a graphics processing unit (GPU) is operating, its supply voltage may be greatly changed due to parasitic impedance of a printed circuit board, parasitic impedance of the package, a voltage drop of the die itself (IR drop), or the change in the drawn current caused by the change of the load. For example, if the load increases rapidly, the supply voltage of the processor will have a large voltage drop due to the rapid increase in the current drawn, which will cause problems in the operation of the processor. In order to solve the above problems, some methods are provided so that the supply voltage of the processor will not drop to a critical value and affect the operation of the processor. The first method is to increase an area of the decoupling capacitor inside the chip, but this method will increase the manufacturing cost of the chip. The second method is to increase the supply voltage of the processor to provide sufficient voltage drop buffer, however, this method will increase the power consumption of the chip and shorten the life of the chip. The third method is to reduce an operating frequency of the processor, however, reducing the operating frequency will affect the performance of the processor. Therefore, how to provide an effective method to solve the voltage drop issue is an important topic.

SUMMARY OF THE INVENTION

It is therefore an objective of the present invention to provide a method which can detect the level of the supply voltage of the processor in a real-time manner, and to select one of a plurality of clock signals to increase or decrease the operating frequency of the processor according to the detected level of the supply voltage, so that the processor can have the operating frequency that is most suitable for the current supply voltage, so as to solve the above-mentioned problems.

In one embodiment of the present invention, a processor comprising a first core circuit, a plurality of clock signal generation circuits, a multiplexer and a first detection circuit is disclosed. The first core circuit is supplied by a supply voltage. The plurality of clock signal generation circuits are configured to generate a plurality of clock signals with different frequencies, respectively, wherein a number of the plurality of clock signals is equal to or greater than three. The multiplexer is configured to receive the plurality of clock signals, and to select one of the plurality of clock signals to serve as an output clock signal according to a control signal, wherein the first core circuit uses the output clock signal to serve as an operating clock. The first detection circuit is configured to detect a level of the supply voltage received by the first core circuit in a real-time manner, to generate the control signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
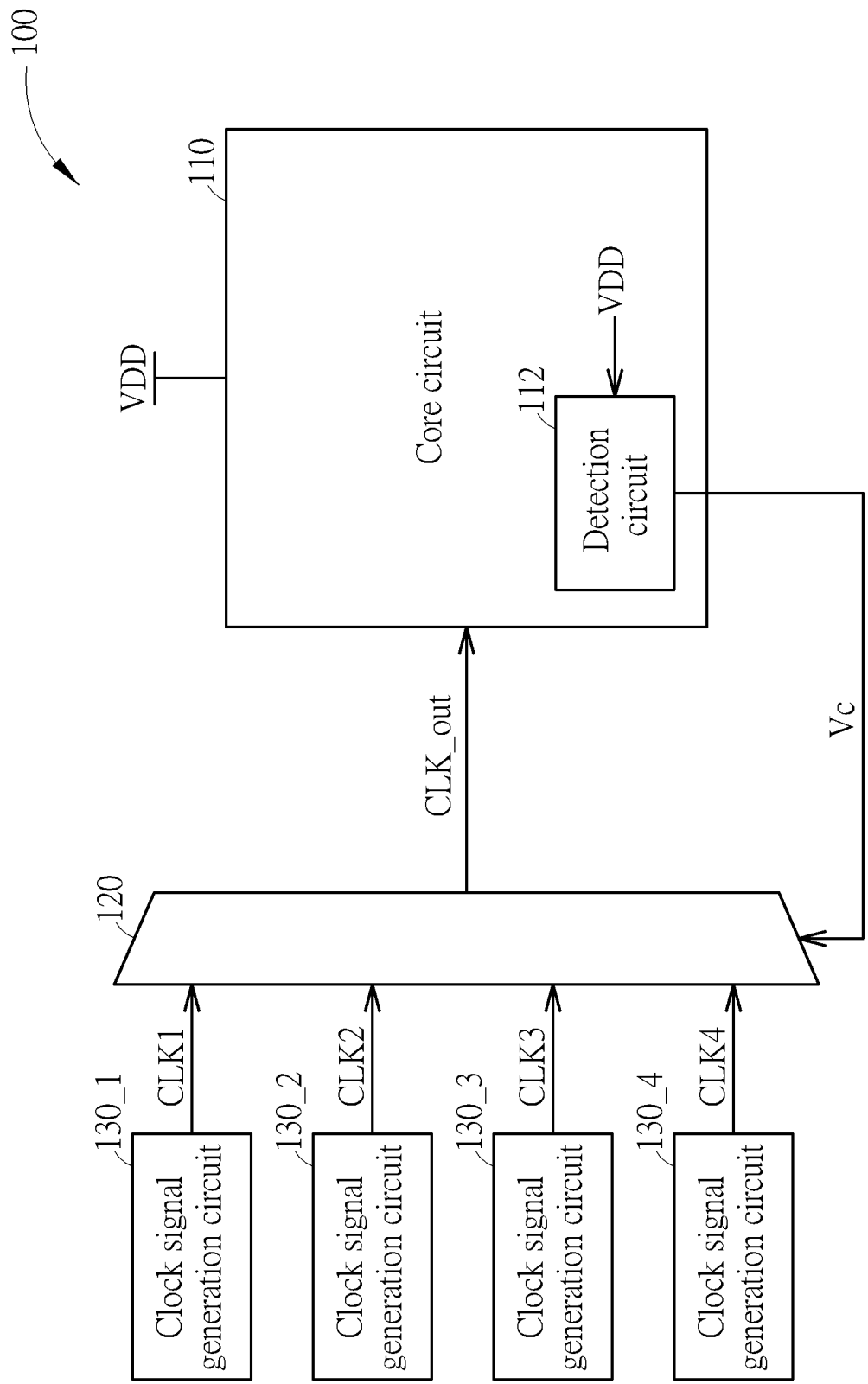
FIG. 1 is a diagram illustrating a processor according to one embodiment of the present invention.

FIG. 1 is a diagram illustrating a processor 100 according to one embodiment of the present invention, where the processor 100 may be a CPU, a GPU or a processor with other functions. As shown in FIG. 1, the processor 100 includes a core circuit 110, a multiplexer 120, and a plurality of clock signal generation circuits 130_1-130_4, wherein the core circuit 110 includes a detection circuit 112. In this embodiment, the clock signal generation circuits 130_1-130_4 can be implemented by using a phase-locked loop, and the clock signal generation circuits 130_1-130_4 are used to generate clock signals CLK1-CLK4 with different frequencies. In one embodiment, the clock signal CLK1 is the clock signal used by the core circuit 110 in the steady state, and the frequencies of the clock signals CLK2-CLK4 can be $(31/32)$, $(30/32)$ and $(29/32)$ of the frequency of the clock signal CLK1, respectively, that is, if the frequency of the clock signal CLK1 is 1.6 GHz, the frequencies of the clock signals CLK2-CLK4 are 1.55 GHz, 1.5 GHz, 1.45 GHz, respectively. In another embodiment, the frequencies of the clock signals CLK2-CLK4 can be $(15/16)$, $(14/16)$ and $(13/16)$ of the frequency of the clock signal CLK1, respectively. In another embodiment, the frequencies of the clock signals CLK2-CLK4 can be $(7/8)$, $(6/8)$ and $(5/8)$ of the frequency of the clock signal CLK1, respectively. In another embodiment, the frequencies of the clock signals CLK2-CLK4 may be $(5/6)$, $(4/5)$, $(2/3)$ of the frequency of the clock signal CLK1, respectively. It is noted that the above-mentioned frequencies of the clock signals CLK1-CLK4 are for illustrative purposes only, not a limitation of the present invention.

FIG. 1 shows four clock signal generation circuits 130_1-130_4. However, the number of clock signal generation circuits may vary according to the designer's consideration. For example, the processor 100 may include eight clock signal generation circuits, and the frequencies of the generated clock signals are f, $(31/32)*f$, $(30/32)*f$, $(29/32)*f$, $(28/32)*f$, $(27/32)*f$, $(26/32)*f$, $(25/32)*f$, respectively. As long as the number of clock signal generation circuits is equal to or greater than three, this alternative design should fall within the scope of the present invention.

In an embodiment, some of the clock signal generation circuits 130_1-130_4 may be shared. For example, the clock signal generation circuits 130_1 and 130_2 have some shared circuits, and/or the clock signal generation circuits 130_3 and 130_4 have some shared circuits.

In FIG. 1, the detection circuit 112 is positioned within the core circuit 110, but this design is not a limitation of the present invention. In other embodiments, the detection circuit 112 can be positioned around the core circuit 110, and this alternative design should fall within the scope of the present invention.

In the operation of the processor 100, the detection circuit 112 detects a level (voltage level) of the supply voltage VDD of the core circuit 110 in a real-time manner, to generate a control signal Vc. For example, the possible variation range of the supply voltage VDD can be divided into 16 intervals, and the control signal Vc is used to indicate which interval the current supply voltage VDD is located, for controlling the operation of the multiplexer 120. In one embodiment, the detection circuit 112 is an analog-to-digital converter (ADC), which is used to convert the supply voltage VDD into a digital signal to serve as the control signal Vc. The multiplexer 120 continuously receives the control signal Vc, and refers to the control signal Vc to determine which of the clock signals CLK1 to CLK4 is selected as the output clock signal CLK out serving as the operating clock of the core circuit 110. For example, suppose that the frequencies of the clock signals CLK1-CLK4 are 1.6 GHz, 1.55 GHz, 1.5 GHz, and 1.45 GHz, respectively, and the possible variation range of the supply voltage VDD can be divided into 16 intervals, for example, the interval '0' to the interval '15' are provided from low to high, and if the control signal Vc indicates that the supply voltage is in the range of interval '0'-interval '3', it means that the level of the current supply voltage VDD is too low, at this time, the multiplexer 120 will select the clock signal CLK4 to serve as the output clock signal CLK out, so that the core circuit 110 operates with a lower frequency. If the control signal Vc indicates that the supply voltage is in the range of interval '4'-interval '7', the multiplexer 120 may select the clock signal CLK3 to serve as the output clock signal CLK out. If the control signal Vc indicates that the supply voltage is in the range of interval '8'-interval '11', the multiplexer 120 may select the clock signal CLK2 to serve as the output clock signal CLK out. If the control signal Vc indicates that the supply voltage is in the range of interval '12'-interval '15', it means that the current supply voltage VDD has a normal voltage level. At this time, the multiplexer 120 will select the clock signal CLK1 to serve as the output clock signal CLK out to make the core circuit 110 operate with a normal frequency to have higher efficiency.

As described above, by using the operations of the above embodiments, the processor 100 can select the best clock signal as the operating clock when the level of the supply voltage VDD changes. In addition, because the processor 100 has many clock signal generation circuits 130_1-130_4, the operating clock (operating frequency) of the processor 100 can change smoothly, and there will be no excessive frequency reduction or excessive frequency increase. Specifically, refer to FIG. 2 which shows the change of the level of the supply voltage VDD, assuming that V1 is the level of the supply voltage VDD in the steady state, and at the beginning, the multiplexer 120 will select the clock signal CLK1 with the highest frequency as the output clock signal CLK out, so that the core circuit 110 has high efficiency. Then, at time t1, the core circuit 110 draws more current due to the increase of the load, which causes the supply voltage VDD to drop. At this time, the detection circuit 112 continuously detects the level of the supply voltage VDD to generate the control signal Vc to the multiplexer 120, so that the multiplexer 120 can sequentially output the clock signals CLK2, CLK3, CLK4 to the core circuit 110, so as to reduce the operating frequency of the core circuit 110 slowly and smoothly. At time t2, the supply voltage VDD starts to rise, the detection circuit 112 continuously detects the level of the supply voltage VDD to generate the control signal Vc to the multiplexer 120, so that the multiplexer 120 can sequentially output the clock signals CLK4, CLK3, CLK2 and CLK1 to the core circuit 110, so as to increase the operating frequency of the core circuit 110 slowly and smoothly.

Figure 2:
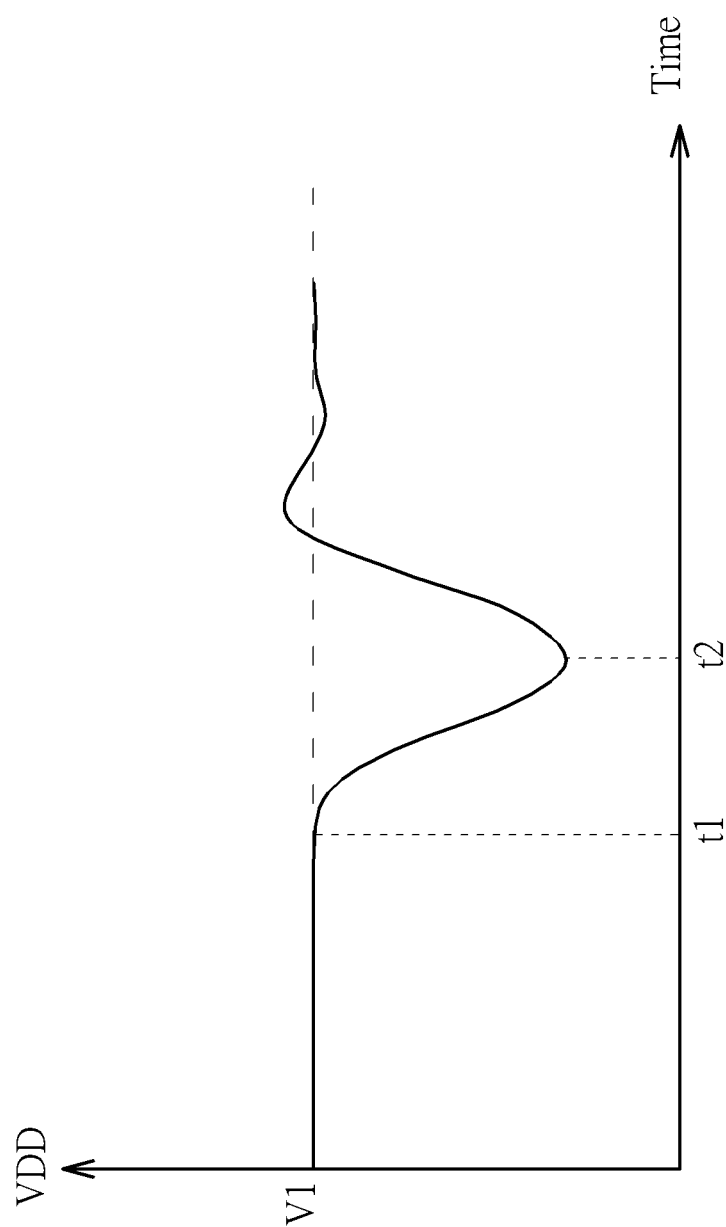
FIG. 2 is diagram of the change of the level of the supply voltage provided to the core circuit.

In the prior art, in order to prevent the core circuit 110 from crashing due to a sudden drop of the supply voltage VDD, the supply voltage VDD is designed to be higher at the beginning, for example, V1 shown in FIG. 2 will be designed with a higher level to cope with various possible situations. However, designing a high-level supply voltage VDD represents high power consumption and a short lifespan. Compared with the prior art, this embodiment can switch the clock signal when the supply voltage VDD changes slightly to avoid operational problems of the core circuit 110. Therefore, this embodiment can design the supply voltage VDD to have a lower voltage level, that is, V1 shown in FIG. 2 has a lower level, to reduce the power consumption of the processor 100.

Figure 3:
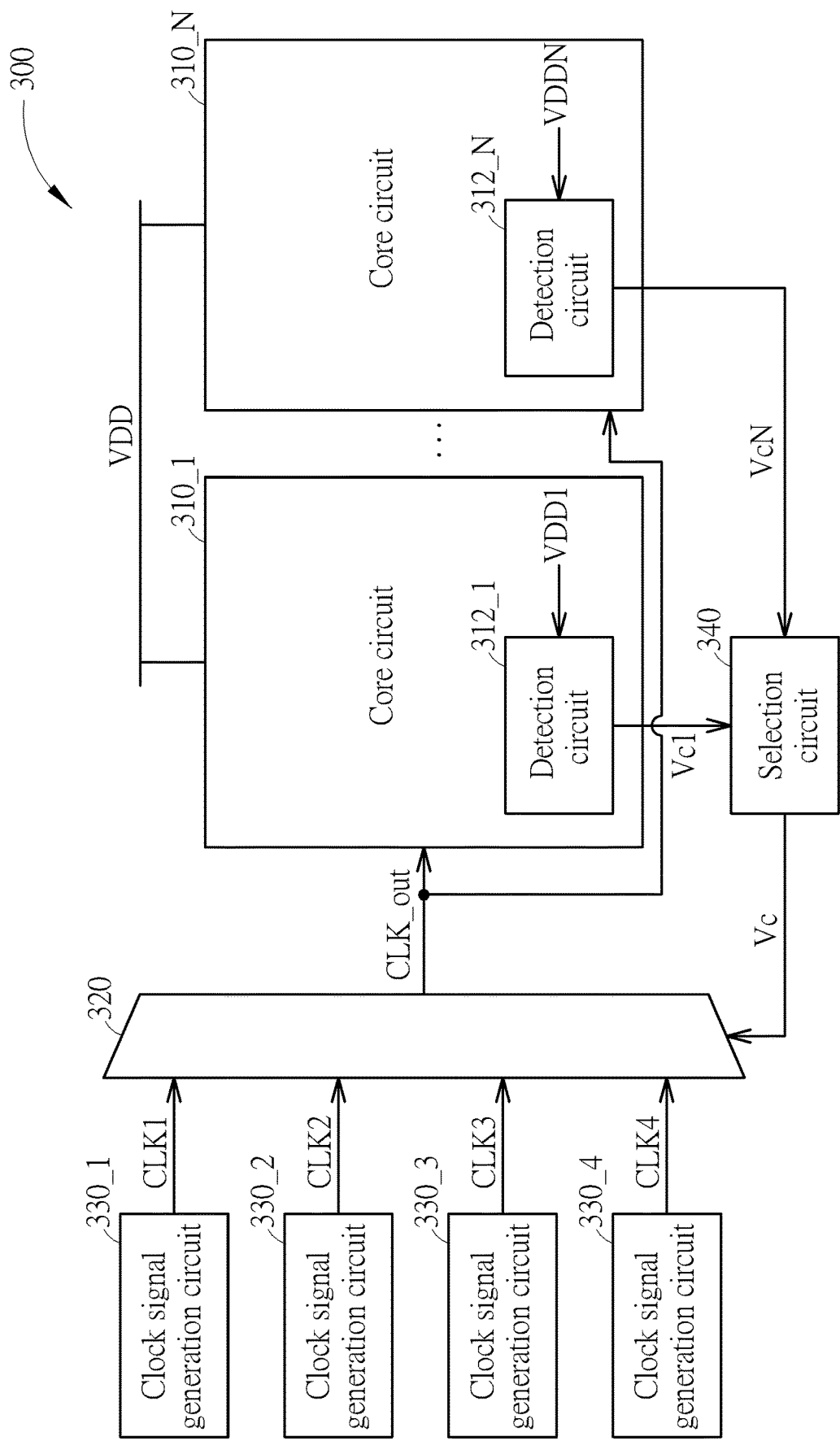
FIG. 3 is a diagram illustrating a processor according to another embodiment of the present invention.

FIG. 3 is a diagram illustrating a processor 300 according to another embodiment of the present invention, where the processor 300 may be a CPU, a GPU or a processor with other functions. As shown in FIG. 3, the processor 300 includes a plurality of core circuits 310_1-310_N, a multiplexer 320, a plurality of clock signal generation circuits 330_1-330_4 and a selection circuit 340, wherein N is any suitable positive integer greater than one, and each core circuit includes a detection circuit. For example, the core circuit 310_1 includes a detection circuit 312_1, and the core circuit 310_N includes a detection circuit 312_N. In this embodiment, the clock signal generation circuits 330_1-330_4 can be implemented by using a phase-locked loop, and the clock signal generation circuits 330_1-330_4 are used to generate clock signals CLK1-CLK4 with different frequencies. In one embodiment, the clock signal CLK1 is the clock signal used by the core circuits 310_1-310_N in the steady state, and the frequencies of the clock signals CLK2-CLK4 can be ($31/32$), ($30/32$) and ($29/32$) of the frequency of the clock signal CLK1, respectively, that is, if the frequency of the clock signal CLK1 is 1.6 GHz, the frequencies of the clock signals CLK2-CLK4 are 1.55 GHz, 1.5 GHz, 1.45 GHz, respectively. In another embodiment, the frequencies of the clock signals CLK2-CLK4 can be ($15/16$), ($14/16$) and ($13/16$) of the frequency of the clock signal CLK1, respectively. In another embodiment, the frequencies of the clock signals CLK2-CLK4 can be ($7/8$), ($6/8$) and ($5/8$) of the frequency of the clock signal CLK1, respectively. In another embodiment, the frequencies of the clock signals CLK2-CLK4 may be ($8/9$), ($4/5$), ($2/3$) of the frequency of the clock signal CLK1, respectively. It is noted that the above-mentioned frequencies of the clock signals CLK1-CLK4 are for illustrative purposes only, not a limitation of the present invention.

FIG. 3 shows four clock signal generation circuits 330_1-330_4. However, the number of clock signal generation circuits may vary according to the designer's consideration. For example, the processor 300 may include eight clock signal generation circuits, and the frequencies of the generated clock signals are f, ($31/32$)*f, ($30/32$)*f, ($29/32$)*f, ($28/32$)*f, ($27/32$)*f, ($26/32$)*f, ($25/32$)*f, respectively. As long as the number of clock signal generation circuits is equal to or greater than three, this alternative design should fall within the scope of the present invention.

In an embodiment, some of the clock signal generation circuits 330_1-330_4 may be shared. For example, the clock signal generation circuits 330_1 and 330_2 have some shared circuits, and/or the clock signal generation circuits 330_3 and 330_4 have some shared circuits.

In FIG. 3, the detection circuits 312_1-312_N are positioned within the core circuits 310_1-310_N, respectively, but this design is not a limitation of the present invention. In other embodiments, the detection circuits 312_1-312_N can be positioned around the core circuits 310_1-310_N, respectively, and this alternative design should fall within the scope of the present invention.

In the operation of the processor 300, the detection circuits 312_1-312_N detect levels (voltage levels) of the supply voltages VDD1-VDDN of the core circuits 310_1-310_N in a real-time manner, to generate control signals Vc1-VcN. In this embodiment, the core circuits 310_1-310_N are powered by the same supply voltage VDD, but because the loads of the core circuit 310_1-310_N are different, VDD1-VDDN are the actual supply voltages received by the core circuits 310_1-310_N respectively. Then, the selection circuit 340 receives the control signals Vc1-VcN, and selects one of the control signals Vc1-VcN to serve as a control signal Vc, wherein the selected one the control signals Vc1-VcN corresponds to a lowest supply voltage among the supply voltages VDD1-VDDN. For example, the possible variation range of the supply voltage VDD1/VDDN can be divided into 16 intervals, and the control signals Vc1/VcN is used to indicate which interval the current supply voltage VDD1/VDDN belongs to. In one embodiment, each of the detection circuits 312_1-312_N is an ADC, which is used to convert the supply voltage VDD1/VDDN into a digital signal to serve as the control signal Vc1/VcN, for the selection circuit 340 to determine the control signal Vc. The multiplexer 320 continuously receives the control signal Vc, and refers to the control signal Vc to determine which of the clock signals CLK1 to CLK4 is selected as the output clock signal CLK out serving as the operating clock of the core circuit 310_1-310_4. For example, suppose that the frequencies of the clock signals CLK1-CLK4 are 1.6 GHz, 1.55 GHz, 1.5 GHz, and 1.45 GHz, respectively, and the possible variation range of the supply voltage VDD can be divided into 16 intervals, for example, from low to high the interval '0' to the interval '15', and if the control signal Vc indicates that the supply voltage VDD is in the range of interval '0'-interval '3', it means that the level of the current supply voltage VDD is too low, at this time, the multiplexer 320 will select the clock signal CLK4 to serve as the output clock signal CLK out, so that the core circuits 310_1-310_N operate with a lower frequency. If the control signal Vc indicates that the supply voltage VDD is in the range of interval '4'-interval '7', the multiplexer 320 may select the clock signal CLK3 to serve as the output clock signal CLK out. If the control signal Vc indicates that the supply voltage VDD is in the range of interval '8'-interval '11', the multiplexer 320 may select the clock signal CLK2 to serve as the output clock signal CLK out. If the control signal Vc indicates that the supply voltage is in the range of interval '12'-interval '15', it means that the current supply voltage VDD has a normal voltage level. At this time, the multiplexer 320 will select the clock signal CLK1 to serve as the output clock signal CLK out to make the core circuits 310_1-310_N operate with a normal frequency to have higher efficiency.

As described above, by using the operations of the above embodiments, the processor 300 can select the best clock signal as the operating clock when the level of the supply voltage VDD changes. In addition, because the processor 300 has many clock signal generation circuits 330_1-330_4, the operating clock (operating frequency) of the processor 300 can change smoothly, and there will be no excessive frequency reduction or excessive frequency increase. In addition, compared with the prior art, this embodiment can switch the clock signal when the supply voltage VDD changes slightly to avoid operational problems of the core circuits 310_1-310_N. Therefore, this embodiment can design the supply voltage VDD to have a lower voltage level to reduce the power consumption of the processor 300.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A processor, comprising:
    a first core circuit, wherein the first core circuit is powered by a supply voltage;
    a plurality of clock signal generation circuits, configured to generate a plurality of clock signals with different frequencies, respectively, wherein a number of the plurality of clock signals is equal to or greater than three;
    a multiplexer, configured to receive the plurality of clock signals, and refer to a control signal to select one of the plurality of clock signals to serve as an output clock signal, wherein the first core circuit uses the output clock signal to serve as an operating clock; and
    a first detection circuit, configured to detect a level of the supply voltage received by the first core circuit in a real-time manner, to generate the control signal;
    wherein the first detection circuit detects the level of the supply voltage received by the first core circuit in the real-time manner to generate a first control signal, and the processor further comprises:
    a second core circuit, wherein the second core circuit is powered by the supply voltage;
    a second detection circuit, configured to detect a level of the supply voltage received by the second core circuit in the real-time manner to generate a second control signal; and
    a selection circuit, configured to select one of the first control signal and the second control signal to serve as the control signal, wherein the selected one of the first control signal and the second control signal corresponds a lower level of the supply voltage.

2. The processor of claim 1, wherein the control signal is used to indicate which of intervals the level of the supply voltage received by the first core circuit or the second core circuit is located, wherein the intervals correspond to the plurality of clock signals; and the multiplexer selects one of the plurality of clock signals as the output clock signal according to the interval in which the level of the supply voltage indicated by the control signal is located.

3. The processor of claim 2, wherein the plurality of clock signals comprise a first clock signal, a second clock signal, and a third clock signal with frequency from high to low, and the intervals comprises a first interval corresponding to the first clock signal, a second interval corresponding to the second clock signal, and a third interval corresponding to the third clock signal; and when the supply voltage drops from the first interval to the third interval, the multiplexer sequentially selects the first clock signal, the second clock signal, and the third clock signal to serve as the output clock signal according to the control signal, for the use of the first core circuit.

4. The processor of claim 2, wherein the plurality of clock signals comprise a first clock signal, a second clock signal, and a third clock signal with frequency from high to low, and the intervals comprises a first interval corresponding to the first clock signal, a second interval corresponding to the second clock signal, and a third interval corresponding to the third clock signal; and when the supply voltage increases from the third interval to the first interval, the multiplexer sequentially selects the third clock signal, the second clock signal, and the first clock signal to serve as the output clock signal according to the control signal, for the use of the first core circuit.

5. The processor of claim 1, wherein the plurality of clock signals are four clock signals, and the frequencies of the four clock signals are f, $(31/32)*f$, $(30/32)*f$ and $(29/32)*f$, respectively, and f is a frequency value.

6. The processor of claim 1, wherein the plurality of clock signals are four clock signals, and the frequencies of the four clock signals are f, $(15/16)*f$, $(14/16)*f$ and $(13/16)*f$, respectively, and f is a frequency value.

7. The processor of claim 1, wherein the plurality of clock signals are four clock signals, and the frequencies of the four clock signals are f, $(5/6)*f$, $(4/5)*f$ and $(2/3)*f$, respectively, and f is a frequency value.

8. The processor of claim 1, wherein the plurality of clock signals are eight clock signals, and the frequencies of the eight clock signals are f, $(31/32)*f$, $(30/32)*f$, $(29/32)*f$, $(28/32)*f$, $(27/32)*f$, $(26/32)*f$ and $(25/32)*f$, respectively, and f is a frequency value.

9. A processor, comprising:
   a first core circuit, wherein the first core circuit is powered by a supply voltage;
   a plurality of clock signal generation circuits, configured to generate a plurality of clock signals with different frequencies, respectively, wherein a number of the plurality of clock signals is equal to or greater than three;
   a multiplexer, configured to receive the plurality of clock signals, and refer to a control signal to select one of the plurality of clock signals to serve as an output clock signal, wherein the first core circuit uses the output clock signal to serve as an operating clock; and
   a first detection circuit, configured to detect a level of the supply voltage received by the first core circuit in a real-time manner, to generate the control signal;
   wherein the first detection circuit detects the level of the supply voltage received by the first core circuit in the real-time manner to generate a first control signal, and the processor further comprises:
   a plurality of second core circuits, wherein the plurality of second core circuit are powered by the supply voltage;
   a plurality of second detection circuits, configured to detect levels of the supply voltages received by the plurality of second core circuits in the real-time manner, to generate a plurality of second control signals, respectively; and
   a selection circuit, configured to select one of the first control signal and the plurality of second control signals to serve as the control signal, wherein the selected one of the first control signal and the plurality of second control signals corresponds a lowest level of the supply voltage.

* * * * *